US010416735B2

(12) United States Patent
Ali

(10) Patent No.: US 10,416,735 B2
(45) Date of Patent: Sep. 17, 2019

(54) HEAT PIPE THERMAL COMPONENT FOR COOLING SYSTEM

(71) Applicant: Google LLC, Mountain View, CA (US)

(72) Inventor: Ihab Ali, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/729,365

(22) Filed: Oct. 10, 2017

(65) Prior Publication Data

US 2019/0107870 A1 Apr. 11, 2019

(51) Int. Cl.
*G06F 1/20* (2006.01)
*F28D 15/04* (2006.01)
(Continued)

(52) U.S. Cl.
CPC ............. *G06F 1/203* (2013.01); *F28D 15/04* (2013.01); *G02B 27/017* (2013.01); *G06F 1/163* (2013.01); *G06F 1/1637* (2013.01); *G06F 1/184* (2013.01); *H05K 1/0206* (2013.01); *H05K 1/181* (2013.01); *H05K 7/2039* (2013.01); *H05K 7/20336* (2013.01)

(58) Field of Classification Search
CPC ........ G06F 1/203; G06F 1/163; G06F 1/1637; G06F 1/184; G06F 3/011; G06F 1/20; F28D 15/04; F28D 15/02; F28D 15/0233; H05K 1/0206; H05K 1/181; H05K 7/20336; H05K 7/2039; G02B 27/017; G02B 2027/014; G02B 2027/0138; A42B 1/008; F28F 21/00
See application file for complete search history.

(56) References Cited

U.S. PATENT DOCUMENTS 8,087,254 B2 1/2012 Arnold
9,733,480 B2 * 8/2017 Baek et al. ........ G02B 27/0176
(Continued)

FOREIGN PATENT DOCUMENTS

CN 206147182 U 11/2016

OTHER PUBLICATIONS

International Search Report and Written Opinion dated Oct. 22, 2018 for corresponding International Application No. PCT/US2018/041889, 12 pages.

*Primary Examiner* — James Wu
*Assistant Examiner* — Michael A Matey

(57) ABSTRACT

A head-mounted display (HMD) device includes a printed circuit board having one or more processors. A heat transfer plate having a heat-generating component facing surface is thermally coupled to the printed circuit board. The HMD exterior-facing surface of the heat transfer plate opposite from the heat-generating component facing surface is thermally coupled to a heat pipe. The heat pipe is thermally coupled to a heat transfer shell, which is configured as a heat sink to receive heat from the heat pipe. In operation, heat flows from the heat-generating components of the HMD (e.g., the HMD's processor and other electronic components) to the heat transfer plate. Thermal energy removed from the heat-generating components is transferred to the heat transfer shell via the heat pipe, which in turn transfers the heat to the external surface of the HMD to be dissipated into ambient room temperature of the surrounding environment.

20 Claims, 5 Drawing Sheets

(51) Int. Cl.

| | |
|---|---|
| *G06F 1/16* | (2006.01) |
| *H05K 1/02* | (2006.01) |
| *H05K 1/18* | (2006.01) |
| *G06F 1/18* | (2006.01) |
| *H05K 7/20* | (2006.01) |
| *G02B 27/01* | (2006.01) |

(56) References Cited

U.S. PATENT DOCUMENTS

| | | | |
|---|---|---|---|
| 10,261,555 B1* | 4/2019 | Cooper | G06F 1/20 |
| 2012/0242698 A1* | 9/2012 | Haddick | G02B 27/0093 |
| | | | 345/633 |
| 2012/0307452 A1 | 12/2012 | Yan et al. | |
| 2015/0234189 A1* | 8/2015 | Lyons | G02B 27/0172 |
| | | | 345/8 |
| 2016/0209659 A1 | 7/2016 | Nikkhoo et al. | |
| 2016/0212879 A1* | 7/2016 | Nikkhoo et al. | H05K 7/20127 |
| 2016/0255748 A1* | 9/2016 | Kim et al. | H05K 7/20972 |
| | | | 361/695 |
| 2017/0060177 A1* | 3/2017 | Rahim | G06F 1/163 |
| 2017/0099749 A1 | 4/2017 | Nikkhoo et al. | |
| 2017/0153672 A1* | 6/2017 | Shin et al. | G02B 27/0176 |
| 2017/0184863 A1* | 6/2017 | Balachandreswaran et al. | |
| | | | G02B 27/0176 |
| 2017/0311483 A1* | 10/2017 | Kawai | G02B 27/0176 |
| 2018/0084647 A1* | 3/2018 | Nalla et al. | H05K 1/0206 |
| 2018/0098465 A1* | 4/2018 | Reynolds | H05K 7/20972 |
| 2018/0196485 A1* | 7/2018 | Cheng | G06F 1/206 |
| 2018/0275399 A1* | 9/2018 | Zhang | G02B 27/0075 |
| 2018/0307282 A1* | 10/2018 | Allin et al. | G06F 1/203 |
| 2018/0376626 A1* | 12/2018 | Hurbi | H05K 7/20963 |
| 2019/0104650 A1* | 4/2019 | McGinty | G06F 1/163 |

\* cited by examiner

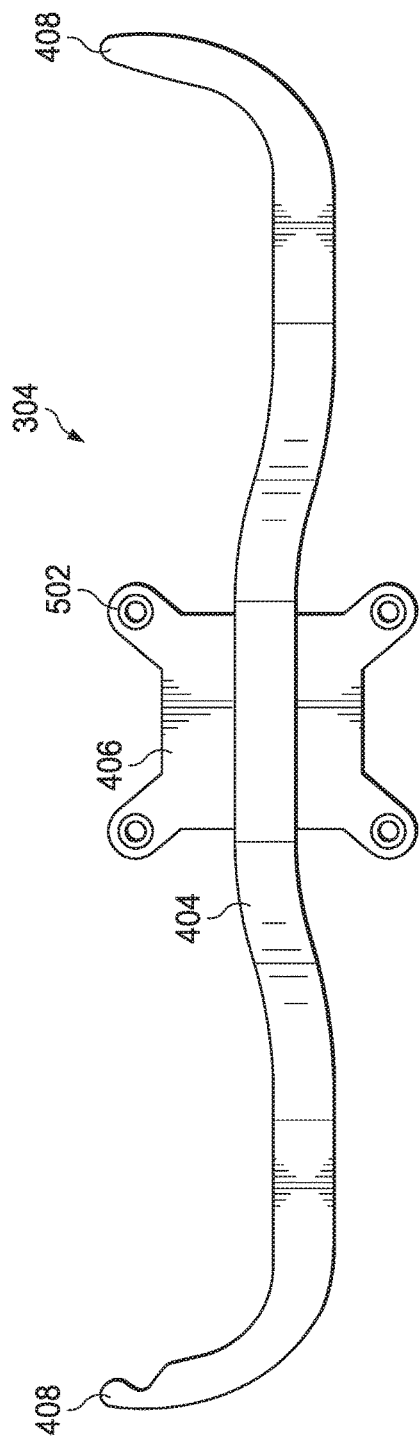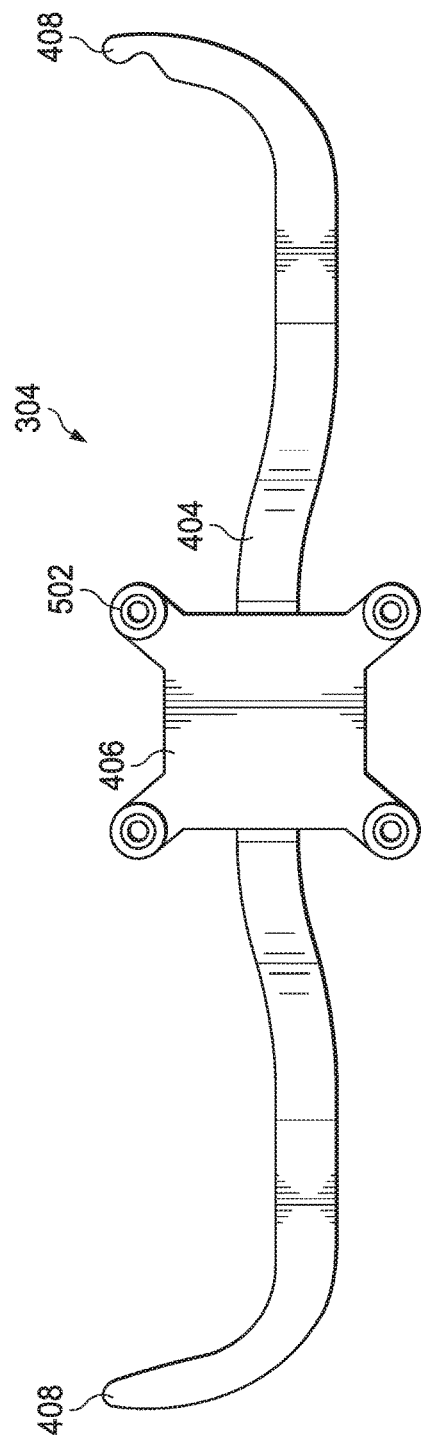
FIG. 5A
FIG. 5B

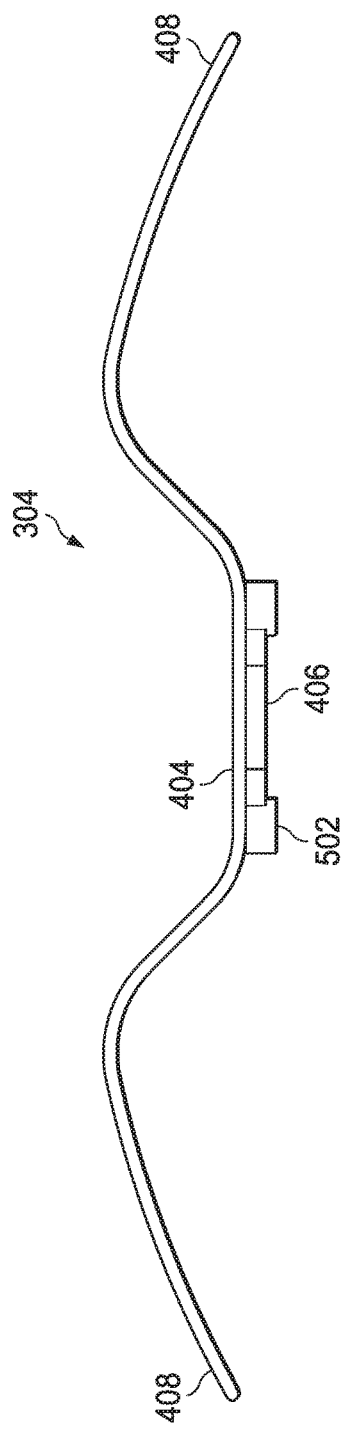
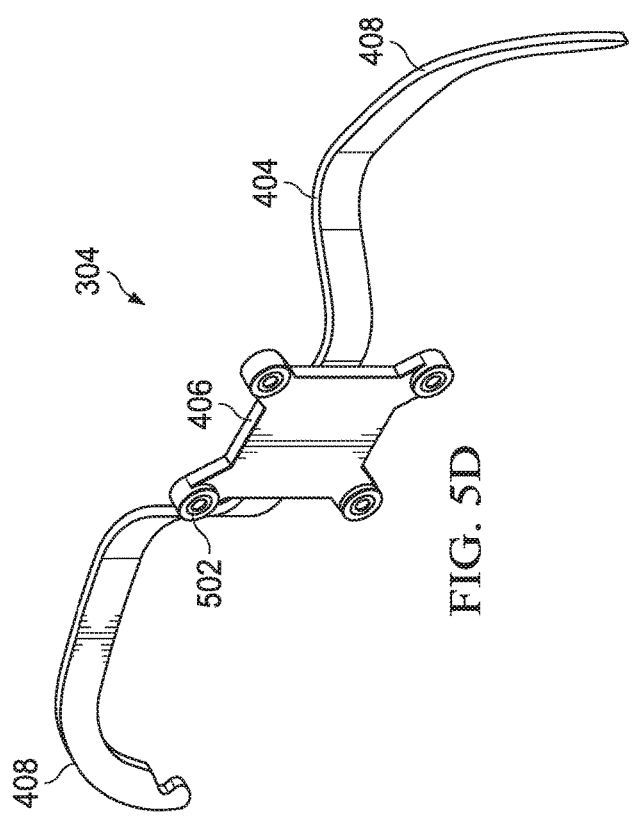

HEAT PIPE THERMAL COMPONENT FOR COOLING SYSTEM

BACKGROUND

Various wearable devices for augmented reality (AR) and virtual reality (VR) applications are implemented as head-mounted devices (HMDs). HMDs, like other computing devices, produce heat during processing operations that should be directed away from the source and dissipated into the surrounding environment. The increasing processing capabilities onboard various HMDs generally correspond to increased heat generation. Device performance, as well as user comfort or safety, may suffer from elevated device temperatures.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIGS. 5A-5D are various perspective views of a heat pipe thermal component in accordance with some embodiments.

DETAILED DESCRIPTION

Traditional methods for cooling electronics include passive cooling methods that are generally bulky and heavy and not particularly suitable for being used in wearable devices. In addition, typical materials used in wearable device housings (e.g. polycarbonate, LCP) have poor thermal properties and create inefficiencies in the thermal system as a whole, which in turn negatively affects device performance. Thus, improving even small inefficiencies in the thermal system will allow for better device performance. Accordingly, FIGS. 1-7 described herein provides for an improved passive cooling system in which thermal energy is transferred from an interior of a HMD to an exterior surface for dissipation into the surrounding environment. For example, according to various embodiments, the HMD includes a heat pipe thermal component having a heat transfer plate and a set of heat pipe legs containing cooling fluid, and a heat transfer shell coupled to the set of the heat pipe legs.

In operation, heat flows from the heat-generating components of the HMD (e.g., the HMD's processor and other electronic components) to a heat transfer plate attached to heat-generating components of the HMD. At the heat transfer plate, thermal energy (i.e., heat) is transferred to the heat transfer plate by thermal conduction and causes an increase in temperature of cooling fluids within a heat pipe coupled to the heat transfer plate. In some embodiments, the cooling fluid travels within heat pipe to heat pipe legs, where the cooling fluid decreases in temperature as the thermal energy is transferred by thermal conduction to a heat transfer shell attached to the housing of the HMD. In other embodiments, thermal energy transferred to the heat pipe from the heat transfer plate is absorbed by the cooling fluid, which causes the cooling fluid to vaporize. The vapor then travels away from the area in contact with the heat transfer plate (i.e., along the length of the heat pipe) to cooler portions of the heat pipe, where the vapor condenses back into a liquid and releases latent heat, which is transferred by thermal conduction to a heat transfer shell in contact with the heat pipe. The lower temperature cooling fluid then returns to the area within heat pipe above the surface of the heat transfer plate (and proximate the heat-generating components).

This process repeats continuously to remove heat from the heat-generating components of the HMD, in which the heat transfer shell operates as a heat sink to receive thermal energy from the heat pipe and transfers the heat to the external surface to be dissipated into ambient room temperature of the surrounding environment by convection off the external surface. In this manner, the heat pipe thermal component described herein provides for a passive cooling system (i.e., does not itself include any electronically active dissipation components such as fans) that allows for improved power consumption efficiency and improved HMD performance.

Figure 1:
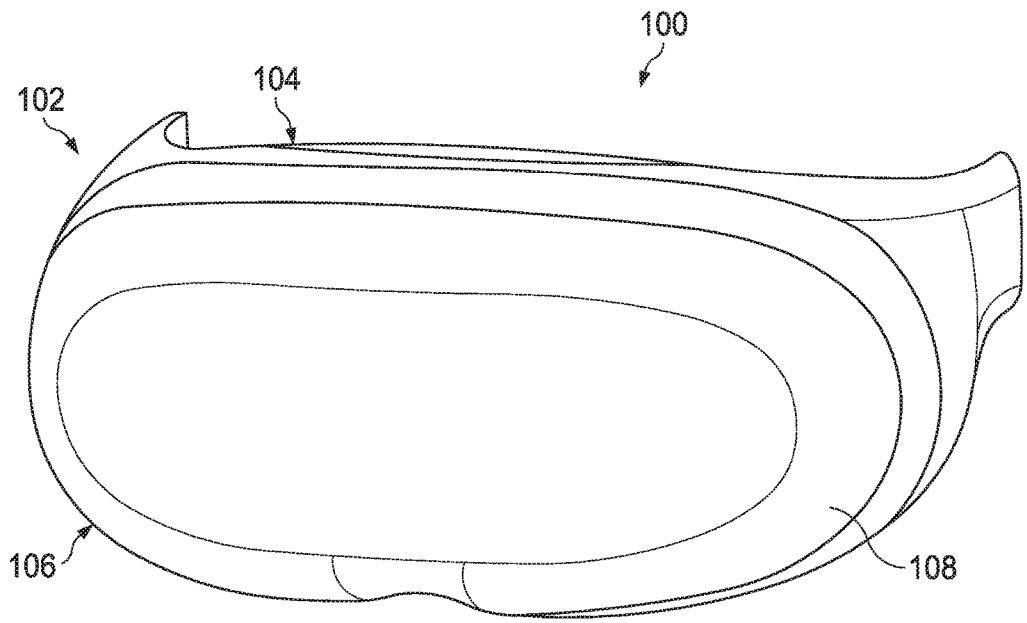
FIG. 1 is a perspective view of a head-mounted display system that utilizes a heat pipe thermal component in accordance with some embodiments.

FIG. 1 illustrates a perspective view of a head-mounted display system 100 that utilizes a heat pipe thermal component in accordance with some embodiments. In some embodiments, the head-mounted display system 100 operates as a virtual reality (VR) headset to present virtual reality imagery to users. In other embodiments, the head-mounted display system 100 operates as an augmented reality (AR) headset and/or a mixed reality (MR) headset. In these embodiments, the head-mounted display system 100 augments views of a physical, real-world environment with computer-generated content (e.g., images, video, sound). In this example, the head-mounted display system 100 includes a housing 102 that contains the components of the head-mounted display system 100 and typically is shaped so as to facilitate mounting on the head of a user. Thus, the housing 102 includes a user-facing side 104 (e.g., from which the user may view a display panel of the head-mounted display system 100) and an opposing forward-facing side 106.

The housing 102 includes various components configured to deliver VR, AR, and/or MR experiences. For example, in various embodiments, the housing 102 may hold head-mounted display system 100 components such as processors, cameras, and display panels to perform operations such as tracking and the display of stereoscopic 3D images. However, similar to other devices which include electronic components, the components of the head-mounted display system 100 produce heat. Removal and/or redirection of this heat is useful in wearable devices, as the surface/skin temperature of the device affects the usability and comfort of the user.

To provide for thermal management, in at least one embodiment the housing 102 of the head-mounted display system 100 implements a heat pipe thermal component (not shown in this perspective view) positioned within the housing 102 to transfer thermal energy (i.e., heat) away from heat generating components of the head-mounted display system 100. In the example of FIG. 1, the heal pipe thermal com transfers heat to an external surface 108 of the housing 102, at which heat transfer occurs from the external surface 108 to the surrounding environment via, for example, thermal convection from air flow over the external surface 108 and/or thermal radiation from the external surface 108. Accordingly, as further described below, the heat pipe thermal component transfers heat away from areas of active, heat-generating components and aids in dissipation of heat into the local environment surrounding the head-mounted display system 100.

In some embodiments, the external surface 108 of the head-mounted display system 100 includes a fabric covering to provide for improved user comfort and/or to aid in aesthetics. In other embodiments, the external surface 108 may be constructed out of other materials (e.g., various polymers and alloys) without departing from the scope of the present disclosure as described herein. It will be appreciated that the material composition of the external surface 108 may alter heat transfer properties of the head-mounted display system 100.

Figure 2:
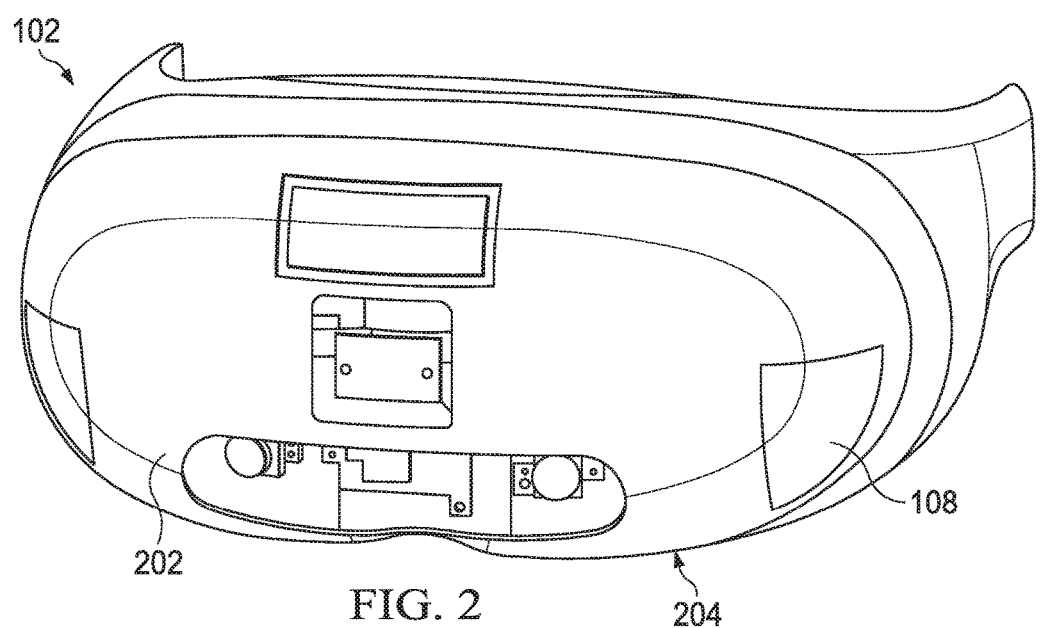
FIG. 2 a perspective view of the head-mounted display system of FIG. 1 with the external surface removed in accordance with some embodiments.

FIG. 2 illustrates a perspective view of the head-mounted display system 100 of FIG. 1 without the external surface 108 in accordance with some embodiments. As illustrated, the housing 102 includes a heat transfer shell 202 positioned underneath the external surface 108. The exterior facing surface 204 (i.e., facing the forward-facing side 106 of the head-mounted display system 100) of the heat transfer shell 202 is in physical contact with and thereby transfers heat to the external surface 108 via thermal conduction. In this example, the heat transfer shell 202 is a mass of thermally conductive material having dimensions approximating the form factor of the head-mounted display system 100. However, the heat transfer shell 202 can alternatively include other configurations without departing from the scope of the present disclosure as described herein.

The heat transfer shell 202 is constructed of a material that is relatively light in weight to reduce the mass of the head-mounted display system 100 and having high heat transfer characteristics to enable rapid transfer of heat from heat-generating components of the head-mounted display system 100 to the external surface 108 for dissipation to the surrounding environment (e.g., air). In some embodiments, the heat transfer shell 202 is a magnesium or magnesium alloy shell that is light and has high heat transfer due to high thermal conductivity. In other embodiments, other materials having a balance between desirable physical properties of low mass density and high thermal conductivity may be used as heat transfer materials in which minimization of weight is sought (e.g., aluminum, aluminum alloys, copper, reinforced carbon fibers, and the like).

Figure 3:
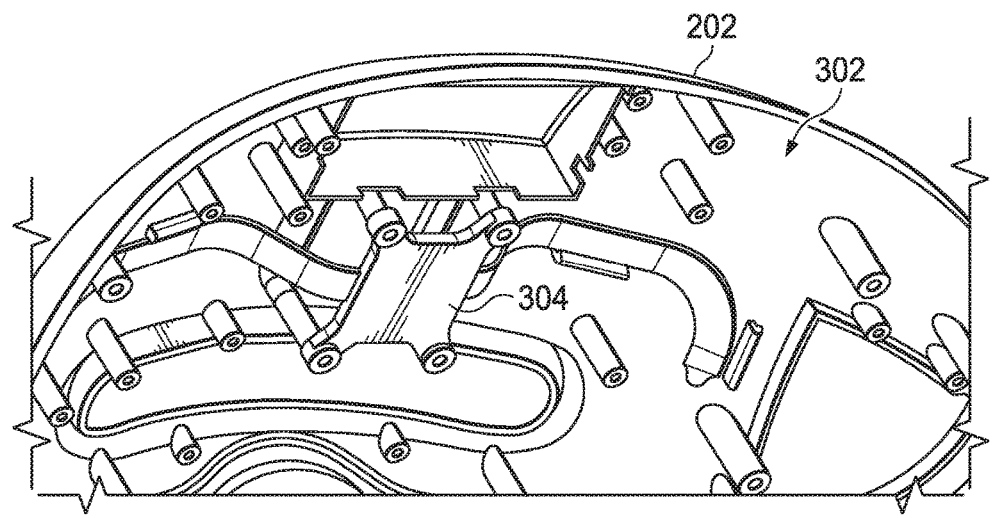
FIG. 3 is a perspective view of an interior facing surface of a heat transfer shell in accordance with some embodiments.
Figure 4:
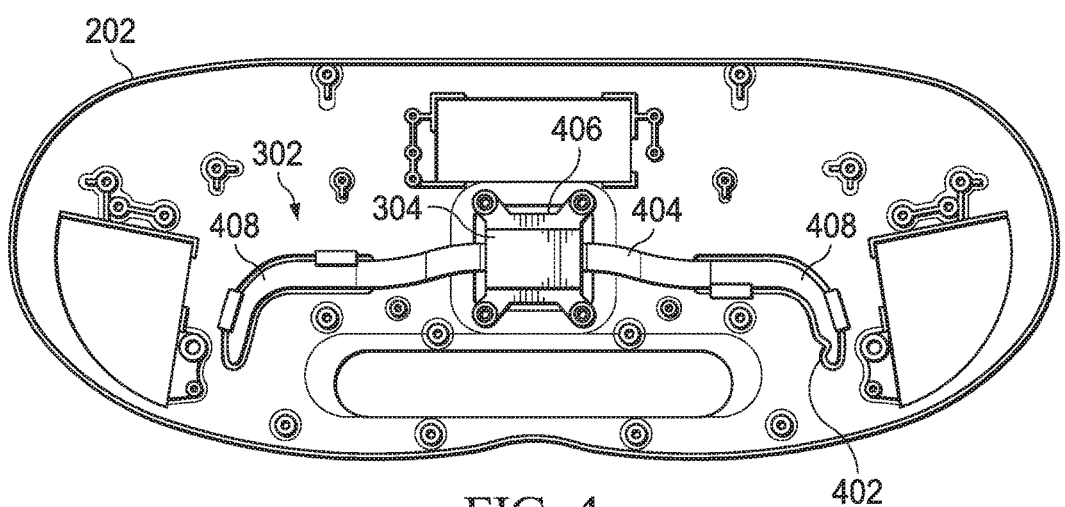
FIG. 4 is another perspective view an interior facing surface of a heat transfer shell in accordance with some embodiments.

FIGS. 3 and 4 are perspective views of an interior facing surface of the heat transfer shell 202 of FIG. 2 in accordance with some embodiments. As illustrated, the interior facing surface 302 (i.e., a user-facing surface facing the user-facing side 104 of the head-mounted display system 100 into the interior of housing 102) is configured to be thermally coupled to a heat pipe thermal component 304 so as to promote a heat exchange process between a heat-generating component (e.g., a processor of the head-mounted display system 100) to a cooling fluid located within the heat pipe thermal component 304 and further to the heat transfer shell 202 for heat dissipation.

In some embodiments, such as illustrated in FIG. 4, the interior facing surface 302 of the heat transfer shell 202 includes a groove 402 within which the heat pipe thermal component 304 sits. As a result of a thermal coupling between the heat pipe thermal component 304 and the groove 402 of the heat transfer shell 202, the operating temperature of heat-generating components (e.g., the printed circuit board (PCB) of FIG. 6) is lowered as a temperature of cooling liquid within the heat pipe 404 rises. In particular, an exterior facing surface (i.e., the side facing the heat transfer shell 202 and facing in the direction of the external environment outside the HMD 100) of the heat pipe legs 408 (i.e., portions of the heat pipe 404 extending axially away from the heat transfer plate 406) is thermally coupled to the heat transfer shell 202. The heat transfer plate 406 is thermally coupled to an interior-facing surface (i.e., the side facing the user's face and facing in the direction of heat-generating components of the HMD 100) of the heat pipe 404 opposite that of the exterior-facing surface. In various embodiments, the heat pipe 404 may be epoxied, welded, or otherwise adhered to the heat transfer shell 202 by a pressure sensitive adhesive (PSA) or any other thermal interface material. In this manner, the heat pipe 404 is thermally attached to the heat transfer shell 202, which acts as a heat sink.

In various embodiments, a thermal gel is used as the cooling liquid within the heat pipe 404, but any suitable cooling liquid may be used without departing from the scope of the present disclosure as described herein. The high temperature thermal gel travels outwardly from a heat transfer plate 406 of the heat pipe thermal component 304 towards the legs 408, where the thermal gel decreases in temperature as heat is transferred via conduction from the heat pipe 404 to the heat transfer shell 202. The cooled thermal gel then returns to the area within heat pipe 404 proximate to the heat transfer plate 406.

FIGS. 5A-5D are various perspective drawings of a heat pipe thermal component in accordance with some embodiments. FIG. 5A is a top view of the heat pipe thermal component 304 showing a first surface (i.e., the exterior-facing surface described above) that thermally couples to the heat transfer shell 202. FIG. 5B is a bottom view of the heat pipe thermal component 304 showing a second surface opposite that of FIG. 5A (i.e., the interior-facing surface described above) with the heat transfer plate 406 that couples to a heat-generating component (e.g., the printed circuit board (PCB) of FIG. 6). Accordingly, this second surface may also be referred to as a heat-generating component facing surface. FIG. 5C is a side view of the heat pipe thermal component 304 and FIG. 5D is a perspective view of the heat pipe thermal component 304.

As illustrated in FIGS. 5A-5D, the heat pipe 404 is a unitary pipe that is bent to have two leg portions 408 extending axially away from the heat transfer plate 406. However, in other embodiments, the heat pipe thermal component 304 may use any number of heat pipes and/or legs. For example, in one alternative embodiment (not shown), the heat pipe component 304 may use two heat pipes for a total of four legs that extend outwards from the heat transfer plate 406 in the direction of four quadrants of the heat transfer shell 202 for increasing the surface area available for heat conduction. Similarly, in another embodiment, the heat pipe component 304 may use a single heat pipe having four legs (e.g., in an "X" configuration) that extend outwards from the heat transfer plate 406 in the direction of four quadrants of the heat transfer shell 202 for increasing the surface area available for heat conduction. Those skilled in the art will recognize that these embodiments are provided for example purposes and are not intended to be limiting as to the scope of this disclosure.

Figure 6:
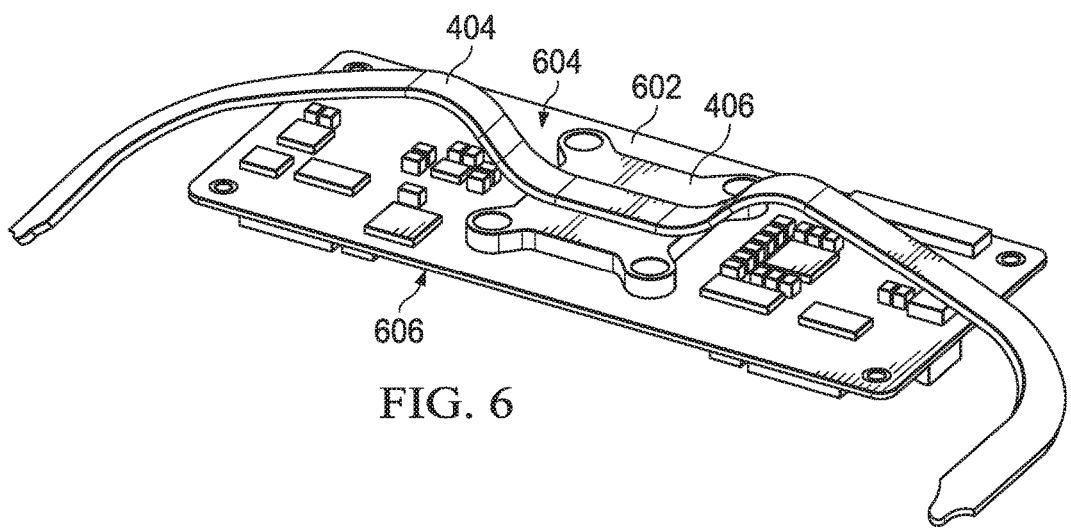
FIG. 6 is a perspective view of a heat transfer plate mounted to a printed circuit board in accordance with some embodiments.

In various embodiments, the heat transfer plate 406 is constructed out of a material having a high thermal conductivity (e.g., aluminum, copper, magnesium, and the like) to facilitate heat transfer from a heat-generating component (e.g., the printed circuit board (PCB) of FIG. 6) to which it is coupled to the heat pipe 404. Further, the heat transfer plate 406 includes one or more mounts 502 to couple the heat-generating component to the heat transfer plate 406. Such mounts 502 may include any suitable number and/or type of PCB mounts such as, for example, screw mounts, terminals, posts, and the like.

FIG. 6 is a perspective view of the heat transfer plate 406 mounted to a PCB 602 in accordance with some embodiments. As shown, the heat transfer plate 406 is mounted to a back surface 604 of the PCB 602. The PCB 602 holds many of the electronic components of the head-mounted display system 100, such as various processors (not shown) memories (not shown), and provides connectors (e.g., board-to-board connectors) for other elements and peripherals. It should be understood that more or less components can be included or excluded from the head-mounted display system 100 described herein, depending on the configuration and functions enabled. For example, in some embodiments, the PCB 602 of the head-mounted display system 100 includes a processor for executing program instructions, a memory device for storage purposes, and in one embodiment, includes both volatile and non-volatile memory. Further, the PCB 602 of the head-mounted display system 100 is also communicably coupled to a display which provides a visual interface that the user views.

The display may be defined by one single display screen, or in the form of a separate display screen for each eye of the user. When two display screens are provided, it is possible to provide left-eye and right-eye video content separately. Separate presentation of video content to each eye, for example, provides for better immersive control of 3D content. As described herein, in one embodiment, the second screen is provided with second screen content by using the output for one eye, and then formatting the content for display in a two-dimensional (2D) format. In some embodiments, a battery is provided as a power source for the PCB 602. In other embodiments, the power source includes an outlet connection to power.

In some embodiments, the PCB 602 includes one or more motion detection modules including any of various kinds of motion sensitive hardware, such as a magnetometer, an accelerometer, and a gyroscope. The accelerometer is a device for measuring acceleration and gravity induced reaction forces. Single and multiple axis (e.g., six-axis) models are able to detect magnitude and direction of the acceleration of the head-mounted display system 100 in different directions. The accelerometer is used to sense inclination, vibration, and shock. In one embodiment, three accelerometers are used to provide the direction of gravity, which gives an absolute reference for two angles (world-space pitch and world-space roll).

The magnetometer measures the strength and direction of the magnetic field in the vicinity of the head-mounted display system 100. In one embodiment, three magnetometers are used within the head-mounted display system 100, ensuring an absolute reference for the world-space yaw angle. In some embodiments, the accelerometer is used together with magnetometer to obtain the inclination and azimuth of the head-mounted display system 100. The gyroscope is a device for measuring or maintaining orientation, based on the principles of angular momentum. In one embodiment, three gyroscopes provide information about movement across the respective axis (x, y and z) based on inertial sensing. The gyroscopes help in detecting fast rotations. However, the gyroscopes drift overtime without the existence of an absolute reference. To reduce the drift, the gyroscopes are reset periodically, which can be done using other available information, such as positional/orientation determination based on visual tracking of an object, accelerometer, magnetometer, etc.

In some embodiments, the head-mounted display system 100 includes a camera for capturing images and image streams of the real-world environment. In one embodiment, more than one camera (optionally) is included in the head-mounted display system 100, including a camera that is forward-facing (i.e., directed away from the user when the user is viewing the display of the head-mounted display system 100), and a camera that is rear-facing (i.e., directed towards the user when the user is viewing the display of the head-mounted display system 100). Additionally, in an embodiment, a depth camera is included in the head-mounted display system 100 for sensing depth information of objects in the real-world environment.

The foregoing components of the PCB 602 have been described as merely exemplary components that may be included in head-mounted display system 100. In various embodiments described in the present disclosure, the head-mounted display system 100 may or may not include some of the various aforementioned components. Embodiments of the head-mounted display system 100 may additionally include other components not presently described, but known in the art, for purposes of facilitating aspects of the present invention as herein described.

In some embodiments, the PCB 602 is thermally enhanced by including through hole thermal vias (not shown) that increase the orthogonal thermal conductivity of the PCB 602. The thermal vias provide an enhanced thermal path for heat flow from a top surface 606 of the PCB 602 to the back surface 604. This provides lower thermal resistance to cool processor(s) of the PCB 602. Further, in some embodiments, thermal coupling between the PCB 602 and the heat pipe component 304 is provided by a layer of thermal interface material that fills macroscopic voids (e.g., air gaps) between, for example, the heat transfer plate 406 and decoupling capacitors (not shown) of the PCB 602. In various embodiments, such thermal interface material may include any thermal gel, compound, paste, and the like configured to increase the thermal conductivity of the interface between the PCB 602 and the heat pipe component 304.

As a result of the thermal coupling between the various components described herein, the operating temperature of the head-mounted display system 100 is lowered by shifting thermal energy away from the user face and PCB 602 to the external surface 108 of the housing 102. For example, according to various embodiments, heat flows through the various thermal couplings described herein from the heat-generating components such as the PCB 602 to the heat transfer plate 406.

Figure 7:
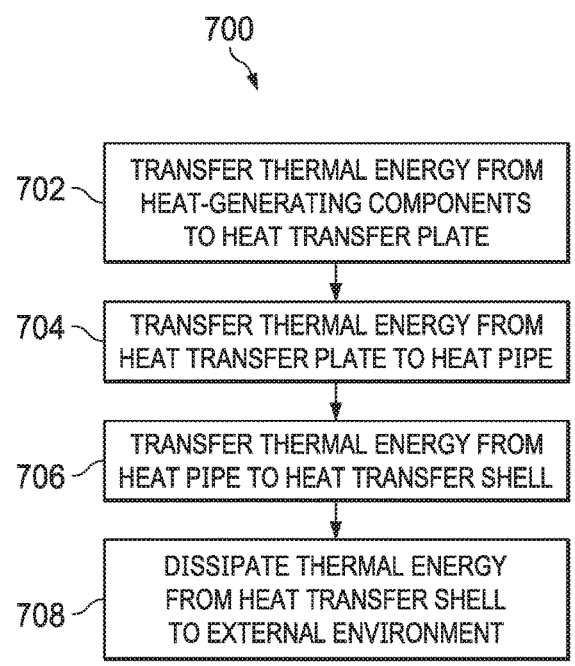
FIG. 7 is a flow diagram of a method of thermal dissipation using a heat pipe thermal component in accordance with some embodiments.

FIG. 7 is a flow diagram illustrating an example method 700 of thermal dissipation using a heat pipe thermal component in accordance with some embodiments. At operation 702, thermal energy (i.e., heat) generated by heat-generating components of a HMD is transferred by thermal conduction from the heat-generating components to a heat transfer plate. For example, as illustrated in FIG. 6, heat is transferred from the PCB 602 to a heat-generating component facing surface of the heat transfer plate 406 that is thermally coupled to the PCB 602. At operation 704, thermal energy is transferred by thermal conduction from the heat transfer plate to a heat pipe. For example, as illustrated in FIGS. 5A-5D, heat is transferred from the heat transfer plate 406 to a HMD interior-facing surface of the heat pipe 404 (as discussed above in more detail). Heat transferred to the heat pipe 404 causes an increase in temperature of cooling fluids within the heat pipe 404.

At operation 706, thermal energy is transferred by thermal conduction from the heat pipe legs to the heat transfer shell. For example, as discussed relative to FIGS. 3-5D, the high temperature cooling fluid travels within heat pipe 404 to the heat pipe legs 408, where it is cooled as the thermal energy is transferred by thermal conduction to the heat transfer shell 202. The lower temperature cooling fluid then returns to the area within heat pipe 404 above the surface of the heat transfer plate 406 (and proximate the PCB 602). In other embodiments, thermal energy transferred to the heat pipe 404 from the heat transfer plate 406 is absorbed by the cooling fluid, which causes the cooling fluid to vaporize. The vapor then travels away from the area in contact with the heat transfer plate (i.e., along the length of the heat pipe legs 408) to cooler portions of the heat pipe 404, where the vapor condenses back into a liquid and releases latent heat, which is transferred by thermal conduction to the heat transfer shell 202 in contact with the heat pipe 404. The lower temperature cooling fluid then returns to the area within heat pipe above the surface of the heat transfer plate 406 (and proximate heat-generating components).

At operation 708, the heat transfer shell 202 operates as a heat sink to receive thermal energy from the heat pipe 404 and transfers the heat to the external surface 108 to be dissipated into ambient room temperature of the surrounding environment by convection off external surface 108. For example, as discussed relative to FIGS. 3-4, a HMD interior-facing surface of the heat transfer shell 202 is thermally coupled to and receives heat from a HMD exterior-facing surface of the heat pipe legs 408. In this manner, the heat pipe thermal component described herein provides for a passive cooling system (e.g, does not include any active, electronic heat dissipation components such as fans) that allows for improved power consumption efficiency and improved head-mounted display system 100 performance. Although the heat pipe thermal component itself does not include electronics, those skilled in the art will recognize that in various embodiments, the heat pipe thermal component described herein can be used in conjunction with other systems that may include such electronic components to achieve further cooling for wearable devices and HMDs.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus, comprising:
    a head-mounted display (HMD) device including a printed circuit board having one or more processors;
    a heat transfer plate having a heat-generating component facing surface thermally coupled to the printed circuit board and a HMD exterior-facing surface opposite from the heat-generating component facing surface that is thermally coupled to a heat pipe; and
    a heat transfer shell thermally coupled to the heat pipe, wherein the heat transfer shell comprises a mass of thermally conductive material configured as a heat sink to receive heat from the heat pipe and transfer heat to an exterior-facing surface of the HMD, wherein the exterior-facing surface of the HMD is substantially parallel to the printed circuit board and the heat pipe.

2. The apparatus of claim 1, wherein the heat pipe includes one or more heat pipe legs extending axially from the heat transfer plate.

3. The apparatus of claim 2, wherein a HMD exterior-facing surface of the one or more heat pipe legs is thermally coupled to the heat transfer shell and a HMD interior-facing surface of the one or more heat pipe legs opposite from the HMD exterior-facing surface is thermally coupled to the heat transfer plate.

4. The apparatus of claim 2, wherein the heat transfer shell includes an indented portion along a HMD interior-facing surface of the heat transfer shell configured to accommodate coupling with the HMD exterior-facing surface of the heat pipe legs.

5. The apparatus of claim 1, wherein the printed circuit board includes one or more thermal vias that provide a heat flow path from a top surface of the printed circuit board to a back surface of the printed circuit board.

6. The apparatus of claim 1, wherein the heat transfer shell comprises a magnesium shell.

7. The apparatus of claim 1, further comprising a thermal interface material layer sandwiched between the heat transfer plate and the printed circuit board.

8. A head-mounted display system, comprising:
   a heat pipe thermal component including a heat pipe and a heat transfer plate, wherein the heat transfer plate has a heat-generating component facing surface and a HMD exterior-facing surface opposite from the heat-generating component facing surface that is thermally coupled to a heat pipe;
   a printed circuit board thermally coupled to the heat-generating component facing surface of the heat transfer plate; and
   a heat transfer shell thermally coupled to the heat pipe, wherein the heat transfer shell comprises a mass of thermally conductive material configured as a heat sink to receive heat from the heat pipe and transfer heat to an exterior-facing surface of the HMD, wherein the exterior-facing surface of the HMD is substantially parallel to the printed circuit board and the heat pipe.

9. The head-mounted display system of claim 8, wherein the heat pipe includes one or more heat pipe legs extending axially away from the heat transfer plate.

10. The head-mounted display system of claim 9, wherein a HMD exterior-facing surface of the one or more heat pipe legs is thermally coupled to the heat transfer shell and a HMD interior-facing surface of the one or more heat pipe legs opposite from the HMD exterior-facing surface is thermally coupled to the heat transfer plate.

11. The head-mounted display system of claim 8, wherein the heat transfer shell includes an indented portion along an interior facing surface configured to accommodate coupling with the heat pipe.

12. The head-mounted display system of claim 8, wherein the printed circuit board includes one or more thermal vias that provide a heat flow path from a top surface of the printed circuit board to a back surface of the printed circuit board.

13. The head-mounted display system of claim 8, wherein the heat transfer shell comprises a magnesium shell.

14. The system of claim 8, further comprising a thermal interface material layer sandwiched between the heat transfer plate and the printed circuit board.

15. A method, comprising:
   providing a head-mounted display (HMD) device including a printed circuit board (PCB) having one or more processors;
   transferring thermal energy generated by the PCB to a heat-generating component facing surface of a heat transfer plate;
   transferring thermal energy from a HMD exterior-facing surface of the heat transfer plate to a HMD interior-facing surface of a heat pipe;
   transferring thermal energy from a HMD exterior-facing surface of the heat pipe to a HMD-interior facing surface of a heat transfer shell, wherein the HMD-interior facing surface is substantially parallel to the printed circuit board and the heat pipe; and
   dissipating thermal energy from the heat transfer shell to an environment external to the HMD device.

16. The method of claim 15, further comprising:
   coupling the heat pipe to an indented portion along the HMD interior-facing surface of the heat transfer shell.

17. The method of claim 15, further comprising:
   coupling one or more heat pipe legs of the heat pipe extending axially away from the heat transfer plate to an indented portion along the HMD interior-facing surface of the heat transfer shell.

18. The method of claim 15, further comprising:
   providing one of more thermal vias through the printed circuit board to provide a heat flow path from a top surface of the printed circuit board to a back surface of the printed circuit board.

19. The method of claim 15, further comprising coupling the heat transfer plate to the printed circuit board by filling a macroscopic gap between the heat transfer plate and the printed circuit board with a thermal interface material.

20. The method of claim 15, further comprising coupling the heat transfer plate to the printed circuit board by coupling the heat transfer plate to the printed circuit board via a set of one or more mounts.

* * * * *